United States Patent
Pikus et al.

(10) Patent No.: US 8,612,919 B2
(45) Date of Patent: Dec. 17, 2013

(54) MODEL-BASED DESIGN VERIFICATION

(75) Inventors: Fedor G. Pikus, Beaverton, OR (US); David A. Abercrombie, Sherwood, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 848 days.

(21) Appl. No.: 11/986,564

(22) Filed: Nov. 20, 2007

(65) Prior Publication Data

US 2008/0189667 A1    Aug. 7, 2008

Related U.S. Application Data

(60) Provisional application No. 60/866,579, filed on Nov. 20, 2006.

(51) Int. Cl.
*G06F 17/50* (2006.01)
*G06F 11/22* (2006.01)

(52) U.S. Cl.
USPC ............ 716/136; 716/102; 716/103; 716/119

(58) Field of Classification Search
USPC ............... 716/5, 136, 119, 102, 103
See application file for complete search history.

(56) References Cited

U.S. PATENT DOCUMENTS

| | | | |
|---|---|---|---|
| 5,581,475 A * | 12/1996 | Majors ............................ | 716/10 |
| 6,011,911 A * | 1/2000 | Ho et al. ........................... | 716/5 |
| 6,063,132 A * | 5/2000 | DeCamp et al. .................. | 716/5 |
| 6,537,844 B1 * | 3/2003 | Itoh .................................. | 438/48 |
| 7,487,474 B2 * | 2/2009 | Ciplickas et al. ................. | 716/2 |
| 2008/0066027 A1 * | 3/2008 | Mantik et al. ..................... | 716/5 |

* cited by examiner

*Primary Examiner* — Stacy Whitmore
*Assistant Examiner* — Magid Dimyan
(74) *Attorney, Agent, or Firm* — Klarquist Sparkman, LLP

(57) ABSTRACT

An analog design-rule-check tool analyzes a microdevice design, such as an integrated circuit design, to identify occurrences of geometric elements that share a specified relationship. When the tool identifies such an occurrence of these geometric elements, it will associate or "cluster" these geometric elements together into an identifiable unit. For specified "clusters" of geometric elements, the analog design-rule-check tool will then determine the value of a measurement or measurements required by a user. Once the analog design-rule-check tool has determined the necessary measurement values, it will use those values to evaluate the function describing a model.

16 Claims, 9 Drawing Sheets

MODEL-BASED DESIGN VERIFICATION

RELATED APPLICATIONS

This application claims priority to U.S. Provisional Patent Application No. 60/866,579 entitled "Flexible Model-Based DRC And DFM Verification," filed on Nov. 20, 2006, and naming Fedor Pikus as inventor, which application is incorporated entirely herein by reference. In addition, this application is related to each of the following patent applications: (1) U.S. Provisional Patent Application No. 60/850,716, entitled "Properties In Electronic Design Automation," filed on Oct. 9, 2006, and naming Fedor Pikus as inventor; (2) U.S. patent application Ser. No. 11/869,717, entitled "Properties In Electronic Design Automation," filed on Oct. 9, 2007, and naming Fedor G. Pikus et al. as inventors; (3) U.S. patent application Ser. No. 11/869,720, entitled "Properties In Electronic Design Automation," filed on Oct. 9, 2007, and naming Fedor G. Pikus et al. as inventors; (4) U.S. patent application Ser. No. 11/869,726, entitled "Properties In Electronic Design Automation," filed on Oct. 9, 2007, and naming Fedor G. Pikus as inventor; and (5) U.S. patent application Ser. No. 11/869,731, entitled "Properties In Electronic Design Automation," filed on Oct. 9, 2007, and naming Fedor G. Pikus as inventor, each of which applications is incorporated entirely herein by reference.

FIELD OF THE INVENTION

The present invention is directed to the use of models in verifying microdevice designs, such as integrated circuit designs. Various implementations of the invention may be useful for performing an analog design-rule-check analysis of a microdevice design, such as an integrated circuit design.

BACKGROUND OF THE INVENTION

Many microdevices, such as integrated circuits, have become so complex that these devices cannot be manually designed. For example, even a simple microprocessor may have millions and millions of transistors that cooperate to form the components of the microprocessor. As a result, electronic design automation tools have been created to assist circuit designers in design a circuit, and then analyzing the circuit design before it is manufactured.

Designing and fabricating microcircuit devices involve many steps during a 'design flow' process. These steps are highly dependent on the type of microcircuit, its complexity, the design team, and the fabricator or foundry that will manufacture the microcircuit from the design. Several steps are common to most design flows, however. First, a design specification is modeled logically, typically in a hardware design language (HDL). Once a logical design has been created, various logical analysis processes are performed on the design to verify its correctness. More particularly, software and hardware "tools" verify that the logical design will provide the desired functionality at various stages of the design flow by running software simulators and/or hardware emulators, and errors are corrected. For example, a designer may employ one or more functional logic verification processes to verify that, given a specified input, the devices in a logical design will perform in the desired manner and provide the appropriate output.

After the logical design is deemed satisfactory, it is converted into physical design data by synthesis software. This physical design data or "layout" design data will include geometric elements representing the image that will be written onto a mask used to fabricate the desired microcircuit device in a photolithographic process at a foundry. While these geometric elements may be of any shape, with conventional mask or reticle writing tools the geometric elements typically will be polygons or line edges used to form polygons. Thus, the layout design data usually includes polygon data describing the features of polygons in the design. It is very important that the physical design information accurately embody the design specification and logical design for proper operation of the device. Accordingly, after it has been created during a synthesis process, the physical design data is compared with the original logical design schematic in a process sometimes referred to as a "layout-versus-schematic" (LVS) verification process.

Once the correctness of the logical design has been verified, and geometric data corresponding to the logical design has been created in a layout design, the geometric data then may be analyzed. For example, because the physical design data is employed to create masks used at a foundry, the data must conform to the foundry's requirements. Each foundry specifies its own physical design parameters for compliance with their processes, equipment, and techniques. Accordingly, the design flow may include a process to verify that the design data complies with the specified parameters. During this process, the physical layout of the circuit design is compared with design rules in a process commonly referred to as a "design rule check" (DRC) process. In addition to rules specified by the foundry, the design rule check process may also check the physical layout of the circuit design against other design rules, such as those obtained from test chips, general knowledge in the industry, previous manufacturing experience, etc. Examples of electronic design automation "verification" tools that perform these types of electronic design, automation verification processes include the Calibre family of software tools available from Mentor Graphics Corporation of Wilsonville, Oreg.

After a designer has used one or more geometry analysis processes to verify that the physical layout of the circuit design is satisfactory, the designer may then perform one or more simulation processes to simulate the operation of a manufacturing process, in order to determine how the design will actually be realized by that particular manufacturing process. A simulation analysis process may additionally modify the design to address any problems identified by the simulation. For example, some design flows may employ one or more processes to simulate the image formed by the physical layout of the circuit design during a photolithographic process, and then modify the layout design to improve the resolution of the image that it will produce during a photolithography process.

These resolution enhancement techniques (RET) may include, for example, modifying the physical layout using optical proximity correction (OPC) or by the addition of sub-resolution assist features (SRAF). Other simulation analysis processes may include, for example, phase shift mask (PSM) simulation analysis processes, etch simulation analysis processes and planarization simulation analysis processes. Etch simulation analysis processes simulate the removal of materials during a chemical etching process, while planarization simulation processes simulate the polishing of the circuit's surface during a chemical-mechanical etching process. These simulation analysis processes may identify, for example, regions where an etch or polishing process will not leave a sufficiently planar surface. These simulation analysis processes may then modify the physical layout design to, e.g., include more geometric elements in those regions to increase their density.

Once a physical layout design has been finalized, the geometric elements in the design are formatted for use by a mask or reticle writing tool. Masks and reticles typically are made using tools that expose a blank reticle or mask substrate to an electron or laser beam (or to an array of electron beams or laser beams), but most mask writing tools are able to only "write" certain kinds of polygons, however, such as right triangles, or rectangles or other trapezoids. Moreover, the sizes of the polygons are limited physically by the maximum beam (or beam array) size available to the tool. Accordingly, the larger polygons in a physical layout design data will typically be "fractured" into the smaller, more basic polygons that can be written by the mask or reticle writing tool.

As electronic design automation verification tools continue to develop, greater sophistication is being demanded from these tools. For example, in addition to detecting obvious design flaws, many electronic design automation verification tools are now expected to identify those design objects in a design that have a significant likelihood of being improperly formed during the manufacturing process, determine the resultant impact on manufacturing yield that these design objects will create, and/or identify design changes that will allow the design objects to be more reliably manufactured during the manufacturing process. Thus, the conventional design-rule-check rules employed by electronic design automation verification tools are becoming more complex as they consider not only single design features, such as wire spacing or gate width, but the interactions of multiple geometric elements in different configurations. This type of electronic design automation verification tool is sometimes referred to as a "design-for-manufacturing" tool.

Early design-for-manufacturing processes focused on addressing only a few specific and well-understood sources of manufacturing yield losses. For example, these design-for-manufacturing processes might typically identify portions of a design where increasing feature dimensions above a design minimum, adding redundant vias, expanding via enclosures, or other specific design improvement techniques could be expected to lead to measurable improvements in manufacturability. As the number of identified yield loss causes has increased, however, so has the complexity of yield prediction, eventually giving rise to a relatively complex set of design rules. Another source of complexity is the need for advanced device characterization, where additional device parameters, such as silicon stress or effective gate dimensions, must be extracted to properly analyze the manufacturability of devices. To address these complexities, some design-rule-check and design-for-manufacturability tools are following the evolution of the optical proximity correction (OPC) electronic design automation tools, from rule-based processes to model-based processes.

Some models are well-established, such as many of the optical models used by optical proximity correction (OPC) electronic design automation tools. Other manufacturing models, however, such as chemical-mechanical polishing (CMP) or strained silicon models, are still being actively developed and refined. Yet other manufacturing models, such as many yield assessment models, may be in the experimental or prototype stage. This diversity in models creates unique challenges for using model-based verification tools. The wide variety of desirable models makes it unlikely that a single verification tool or even an integrated set of verification tools contains all of the necessary models. On the other hand, using a collection of disparate design verification tools for every aspect of a design and manufacturing analysis that may require modeling makes design flow integration much more difficult. Further, some models may be very specific to a particular design methodology or manufacturing process, or contain sensitive proprietary information, preventing a designer from using commercially available verification tools.

BRIEF SUMMARY OF THE INVENTION

Aspects of the invention relate to techniques that flexibly allow a designer to create a wide variety of models for use an electronic design automation verification process. In particular, various embodiments of the invention allow desired models to be programmed in the physical verification tool itself, as an extension of its existing capabilities for layout analysis.

According to various implementations of the invention, a user provides an analog design-rule-check tool with input data identifying the geometric elements in a layout design that will be employed in a model, and the relationship between those geometric elements that is required by the model. For example, if the model characterizes an aspect of transistor wells, then it may take into account the regions in a layer of polysilicon material that overlap regions in a layer of active material. A user then will input one or more measurements required for the model, such as, e.g., the area of a polysilicon region overlapping an active region. Still further, the user will provide the function defining the model.

In response, the analog design-rule-check tool will analyze a microdevice design, such as an integrated circuit design, to identify occurrences of the geometric elements stipulated by the user that share the specified relationship. When the tool identifies such an occurrence of these geometric elements, it will associate or "cluster" these geometric elements together into an identifiable unit. For example, the modeling tool may create a cluster data object that lists the associated geometric elements or otherwise relates these geometric elements to each other. For specified "clusters" of geometric elements, the analog design-rule-check tool will then determine the value of the measurement or measurements required by the user. Once the analog design-rule-check tool has determined the necessary measurement values, it will use those values to evaluate the function describing the model. These and other features and aspects of the invention will be apparent upon consideration of the following detailed description.

DETAILED DESCRIPTION OF THE INVENTION

Operating Environment

As will be discussed in more detail below, various embodiments of the invention relate to analog design-rule-check tools for creating and implementing models for various electronic design automation verification processes. With some examples of the invention, an analog design-rule-check tool can be incorporated into a larger electronic design automation verification tool. For still other examples of the invention, an analog design-rule-check tool can be configured as a separate, stand-alone tool. With both arrangements, however, an analog design-rule-check tool according to various embodiments of the invention may be implemented using computer-executable software instructions executable or executed by one or more programmable computing devices.

Because various embodiments of the invention may be implemented using software instructions, the components and operation of a generic programmable computer system on which various embodiments of the invention may be employed will first be described. Due to the complexity of some electronic design automation processes and the large size of many circuit designs, various electronic design automation are configured to operate on a computing system capable of simultaneously running multiple processing threads. Accordingly, the components and operation of a computer network having a host or master computer and one or more remote or servant computers therefore will be described in particular with reference to FIG. 1. This operating environment is only one example of a suitable operating environment, however, and is not intended to suggest any limitation as to the scope of use or functionality of the invention.

Figure 1:
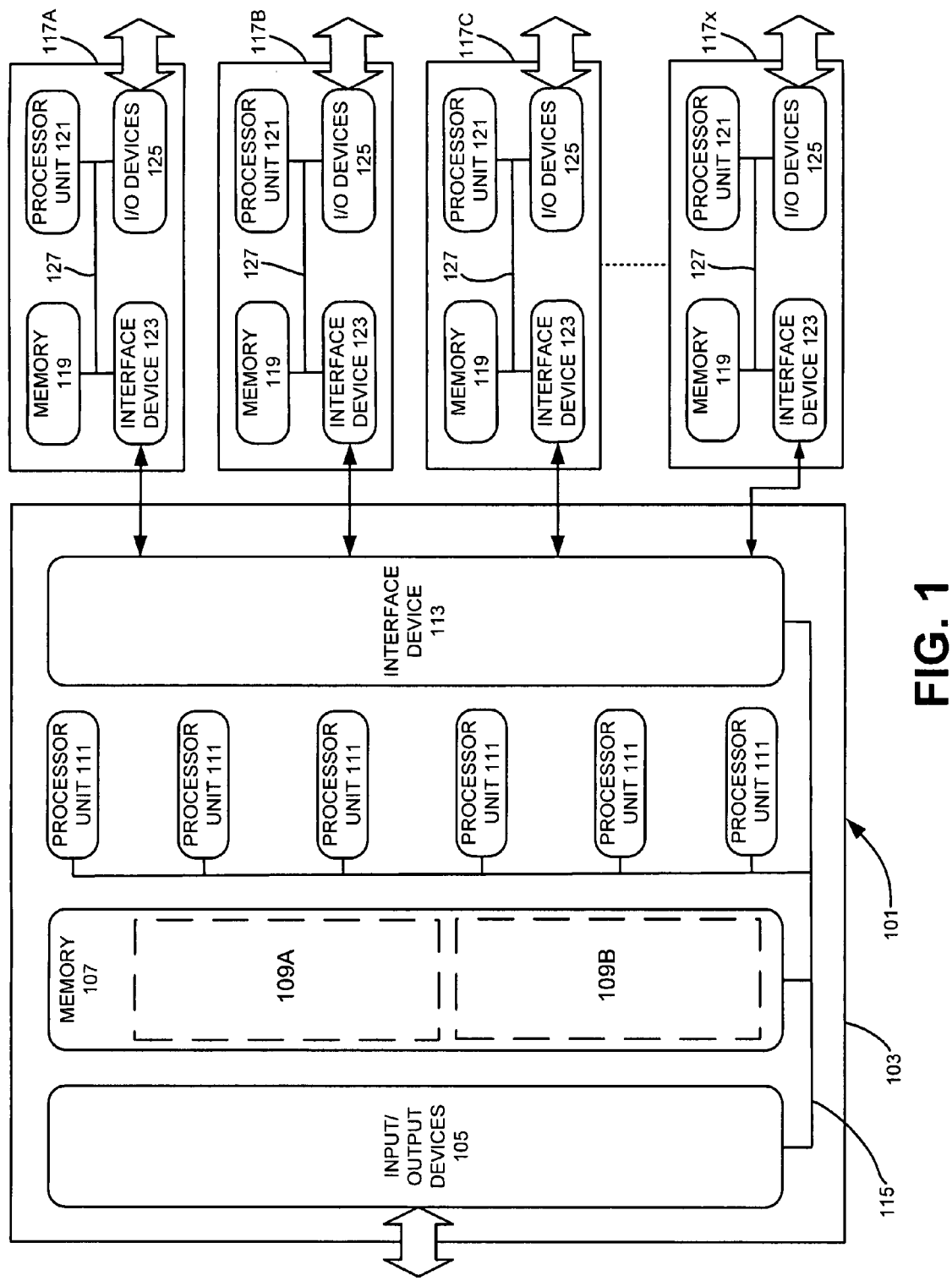
FIG. 1 illustrates an example of a computing system that may be used to implement various embodiments of the invention.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the invention. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
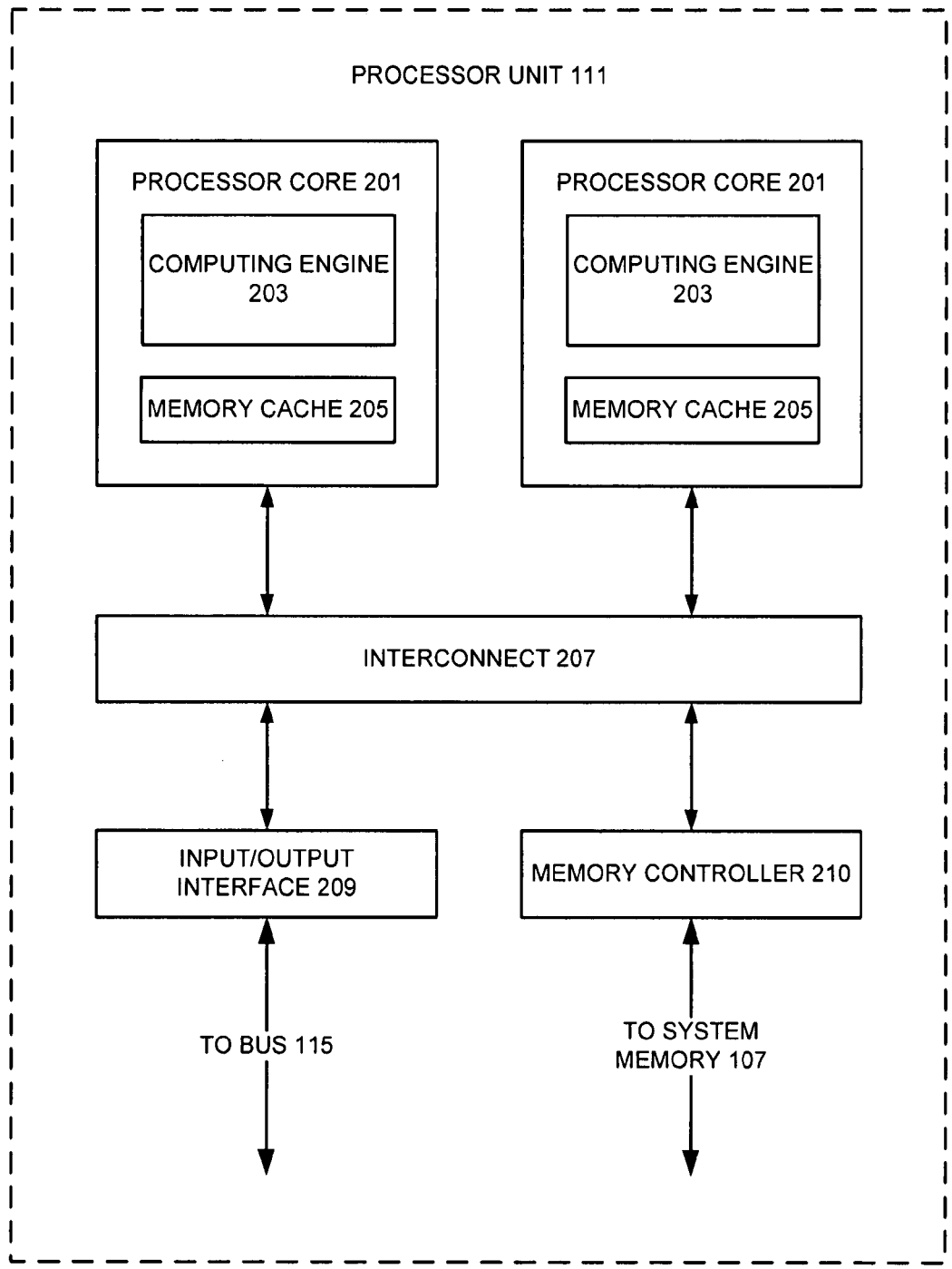
FIG. 2 illustrates an example of a multi-core processor unit that may be used to implement various embodiments of the invention.

With some implementations of the invention, the master computing device 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 211. The input/output interface 209 provides a communication interface between the processor unit 201 and the bus 115. Similarly, the memory controller 211 controls the exchange of information between the processor unit 201 and the system memory 107. With some implementations of the invention, the processor units 201 may include additional components, such as a high-level cache memory accessible shared by the processor cores 201.

While FIG. 2 shows one illustration of a processor unit 201 that may be employed by some embodiments of the invention, it should be appreciated that this illustration is representative only, and is not intended to be limiting. For example, some embodiments of the invention may employ a master computer 103 with one or more Cell processors. The Cell processor employs multiple input/output interfaces 209 and multiple memory controllers 211. Also, the Cell processor has nine different processor cores 201 of different types. More particularly, it has six or more synergistic processor elements (SPEs) and a power processor element (PPE). Each synergistic processor element has a vector-type computing engine 203 with 428×428 bit registers, four single-precision floating point computational units, four integer computational units, and a 556 KB local store memory that stores both instructions and data. The power processor element then controls that tasks performed by the synergistic processor elements. Because of its configuration, the Cell processor can perform some mathematical operations, such as the calculation of fast Fourier transforms (FFTs), at substantially higher speeds than many conventional processors.

It also should be appreciated that, with some implementations, a multi-core processor unit 111 can be used in lieu of multiple, separate processor units 111. For example, rather than employing six separate processor units 111, an alternate implementation of the invention may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the invention, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the invention may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the invention, either the computer 103, one or more of the servant computers 117, or some combination of both may use two or more different interface devices 113 or 123 for communicating over multiple communication interfaces.

With various examples of the invention, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the invention, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer system illustrated in FIG. 1 and FIG. 2 is provided as an example only, and it not intended to suggest any limitation as to the scope of use or functionality of alternate embodiments of the invention.

Electronic Design Automation

As previously noted, various embodiments of the invention are related to electronic design automation. In particular, various implementations of the invention may be used to improve the operation of electronic design automation software tools that identify, verify and/or modify layout design data for manufacturing a microdevice, such as a microcircuit. As used herein, the terms "design" and "design data" are intended to encompass layout design data describing an entire microdevice, such as an integrated circuit device or microelectromechanical system (MEMS) device. These terms also are intended to encompass a smaller set of layout design data describing one or more components of an entire microdevice, however, such as a layer of an integrated circuit device, or even a portion of a layer of an integrated circuit device. Still further, the terms "design" and "design data" are intended to encompass data describing more than one microdevice as well, such as data to be used to create a mask or reticle for simultaneously forming multiple microdevices on a single wafer. A layout design will provide geometric elements representing the image that will be written onto a mask used to fabricate the desired microcircuit device in a photolithographic process at a foundry. While these geometric elements may be of any shape, they typically will be whole polygons, line edges used to form polygons, or groups of line edges used to form polygons. With various examples of the invention, these geometric elements can be described using any desired mechanism, such as vertices, vectors, or some combination thereof.

As previously noted, various examples of the invention may be particularly applicable to one or more electronic design automation processes for verifying that the circuit design complies with specified requirements, identifying problems in the design, modifying the circuit design to improve its manufacturability, or some combination thereof. To facilitate an understanding of various embodiments of the invention, one family of tools for automatic design automation, directed to the analysis and modification of a design for an integrated circuit, will now be generally described.

Figure 3:
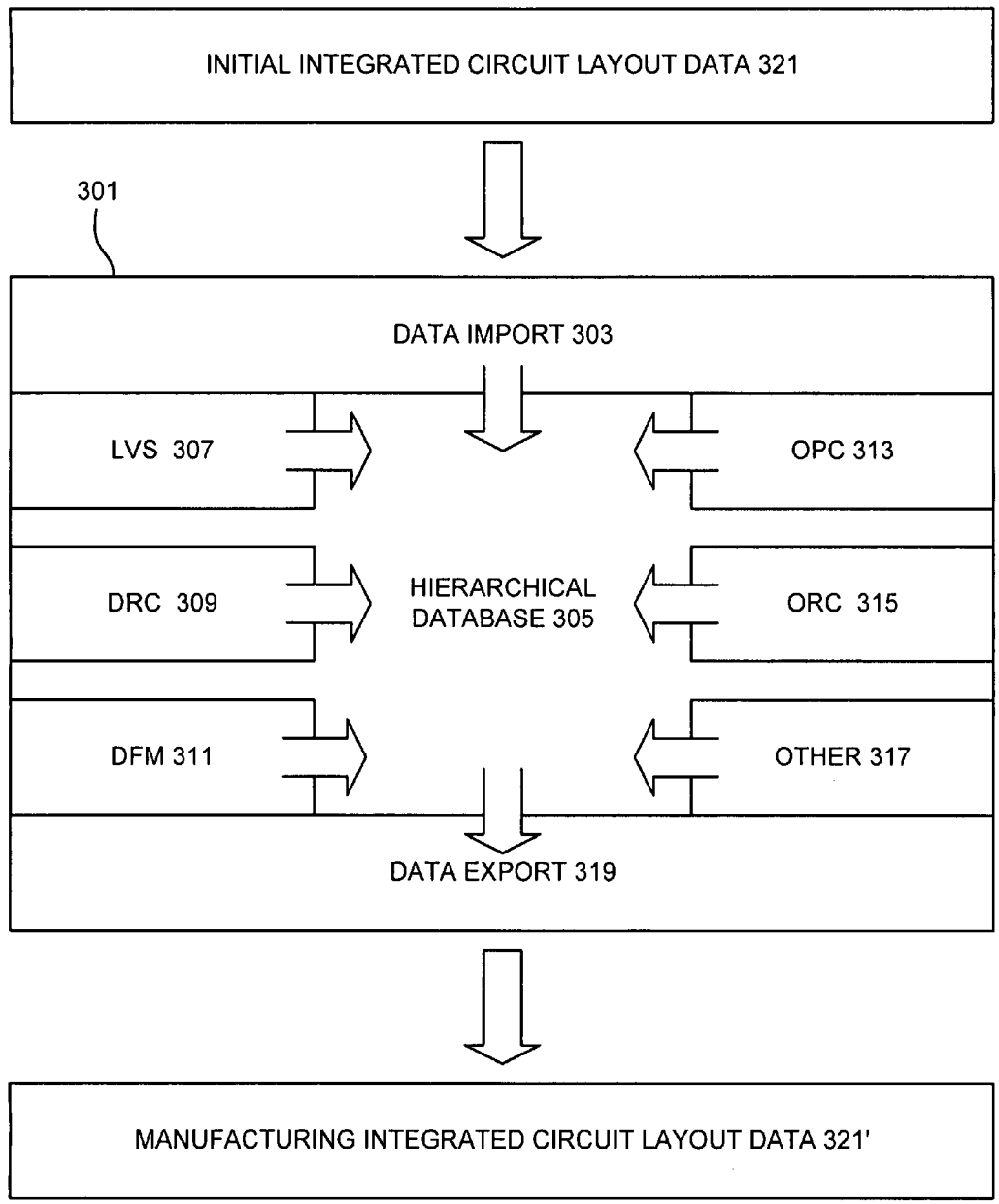
FIG. 3 schematically illustrates an example of a family of software tools for automatic design automation that may be employed with various embodiments of the invention.

Turning now to FIG. 3, an analysis system 301, which may be implemented by a variety of different software application tools, includes a data import module 303 and a hierarchical database 305. The analysis system 301 also includes a layout-versus-schematic (LVS) verification module 307, a design rule check (DRC) module 309, a design-for-manufacturing (DFM) module 311, an optical proximity correction (OPC) module 313, and an optical proximity rule check (ORC) module 315. The analysis system 301 may further include other modules 317 for performing additional functions as desired, such as a phase shift mask (PSM) module (not shown), an etch simulation analysis module (not shown) and/or a planarization simulation analysis module (not shown). The system 301 also has a data export module 319. One example of tools that may be employed for such an analysis system is the Calibre family of software tools available from Mentor Graphics Corporation of Wilsonville, Oreg.

Initially, the system 301 receives data 321 describing a physical layout design for an integrated circuit. The layout design data 321 may be in any desired format, such as, for example, the Graphic Data System II (GDSII) data format or the Open Artwork System Interchange Standard (OASIS) data format proposed by Semiconductor Equipment and Materials International (SEMI). Other formats for the data 321 may include an open source format named Open Access, Milkyway by Synopsys, Inc., and EDDM by Mentor Graphics, Inc. The layout data 321 includes geometric elements for manufacturing one or more portions of an integrated circuit device. For example, the initial integrated circuit layout data 321 may include a first set of polygons for creating a photolithographic mask that in turn will be used to form an isolation region of a transistor, a second set of polygons for creating a photolithographic mask that in turn will be used to form a contact electrode for the transistor, and a third set of polygons for creating a photolithographic mask that in turn will be used to form an interconnection line to the contact electrode. The initial integrated circuit layout data 321 may be converted by the data import module 303 into a format that can be more efficiently processed by the remaining components of the system 301.

Once the data import module 303 has converted the original integrated circuit layout data 321 to the appropriate format, the layout data 321 is stored in the hierarchical database 305 for use by the various operations executed by the modules 305-317. Next, the layout-versus-schematic module 307 checks the layout design data 321 in a layout-versus-schematic process, to verify that it matches the original design specifications for the desired integrated circuit. If discrepancies between the layout design data 321 and the logical design for the integrated circuit are identified, then the layout design data 321 may be revised to address one or more of these discrepancies. Thus, the layout-versus-schematic process performed by the layout-versus-schematic module 307 may lead to a new version of the layout design data with revisions. The layout data 321 may be manually revised by a user, automatically revised by the layout-versus-schematic module 307, or some combination thereof.

Next, the design rule check module 309 confirms that the verified layout data 321 complies with defined geometric design rules. If portions of the layout data 321 do not adhere to or otherwise violate the design rules, then the layout data 321 may be modified to ensure that one or more of these portions complies with the design rules. The design rule check process performed by the design rule check module 309 thus also may lead to a new version of the layout design data with various revisions. Again, the layout data 321 may be manually modified by a user, automatically modified by the design rule check module 309, or some combination thereof.

The modified layout data 321 is then processed by the design for manufacturing module 311. As previously noted, a "design-for-manufacture" process attempts to identify elements in a design representing structures with a significant likelihood of being improperly formed during the manufacturing process. A "design-for-manufacture" process may additionally determine what impact that likelihood of the improper formation of the identified structures will have on the yield of devices manufactured from the circuit design, and/or modifications that will reduce the likelihood that the identified structures will be improperly formed during the manufacturing process. For example, a "design-for-manufacture" (DFM) software tool may identify wires that are connected by single vias, determine the yield impact based upon the probability that each individual single via will be improperly formed during the manufacturing process, and then identify areas where redundant visa can be formed to supplement the single vias.

It should be noted that, in addition to the term "design-for-manufacture," various alternate terms are used in the electronic design automation industry. Accordingly, as used herein, the term "design-for-manufacture" or "design-for-manufacturing" is intended to encompass any electronic design automation process that identifies elements in a design representing structures that may be improperly formed during the manufacturing process. Thus, "design-for-manufacture" (DFM) software tools will include, for example, "lithographic friendly design" (LFD) tools that assist designers to make trade-off decisions on how to create a circuit design that is more robust and less sensitive to lithographic process windows. They will also include "design-for-yield" (DFY) electronic design automation tools, "yield assistance" electronic design automation tools, and "chip cleaning" and "design cleaning" electronic design automation tools.

The processed layout data 321 is then passed to the optical proximity correction module 313, which corrects the layout data 321 for manufacturing distortions that would otherwise occur during the lithographic patterning. For example, the optical proximity correction module 313 may correct for image distortions, optical proximity effects, photoresist kinetic effects, and etch loading distortions. The layout data 321 modified by the optical proximity correction module 313 then is provided to the optical process rule check module 315

The optical process rule check module 315 (more commonly called the optical rules check module or ORC module) ensures that the changes made by the optical proximity correction module 313 are actually manufacturable, a "downstream-looking" step for layout verification. This compliments the "upstream-looking" step of the LVS performed by the LVS module 307 and the self-consistency check of the DRC process performed by the DRC module 309, adding symmetry to the verification step. Thus, each of the processes performed by the design for manufacturing process 311, the optical proximity correction module 313, and the optical process rule check module 315 may lead to a new version of the layout design data with various revisions.

As previously noted, other modules 317 may be employed to perform alternate or additional manipulations of the layout data 321, as desired. For example, some implementations of the tool 301 may employ, for example, a phase shift mask module. As previously discussed, with a phase-shift mask (PSM) analysis (another approach to resolution enhancement technology (RET)), the geometric elements in a layout design are modified so that the pattern they create on the reticle will introduce contrast-enhancing interference fringes in the image. The system 301 also may alternately or additionally employ, for example, an etch simulation analysis processes or a planarization simulation analysis processes. The process or processes performed by each of these additional modules 317 may also lead to the creation of a new version of the layout data 321 that includes revisions.

After all of the desired operations have been performed on the initial layout data 321, the data export module 319 converts the processed layout data 321 into a desired data format. For example, the data export module 319 (or another intermediate data conversion device) may output the processed layout data 321 as manufacturing integrated circuit layout data 323 that can be used to form one or more masks or reticules to manufacture the integrated circuit.

It should be appreciated that various design flows may repeat one or more processes in any desired order. Thus, with some design flows, geometric analysis processes can be interleaved with simulation analysis processes and/or logical analysis processes. For example, once the physical layout of the circuit design has been modified using resolution enhancement techniques, then a design rule check process or design-for-manufacturing process may be performed on the modified layout, Further, these processes may be alternately repeated until a desired degree of resolution for the design is obtained. Similarly, a design rule check process and/or a design-for-manufacturing process may be employed after an optical proximity correction process, a phase shift mask simulation analysis process, an etch simulation analysis process or a planarization simulation analysis process. Examples of electronic design tools that employ one or more of the logical analysis processes, geometry analysis processes or simulation analysis processes discussed above are described in U.S. Pat. No. 6,230,299 to McSherry et al., issued May 8, 2001, U.S. Pat. No. 6,249,903 to McSherry et al., issued Jun. 19, 2001, U.S. Pat. No. 6,339,836 to Eisenhofer et al., issued Jan. 15, 2002, U.S. Pat. No. 6,397,372 to Bozkus et al., issued May 28, 2002, U.S. Pat. No. 6,415,421 to Anderson et al., issued Jul. 2, 2002, and U.S. Pat. No. 6,425,113 to Anderson et al., issued Jul. 23, 2002, each of which are incorporated entirely herein by reference.

Microdevice Design Data Organization

The design of a new integrated circuit may include the interconnection of millions of transistors, resistors, capacitors, or other electrical structures into logic circuits, memory circuits, programmable field arrays, and other circuit devices. In order to allow a computer to more easily create and analyze these large data structures (and to allow human users to better understand these data structures), they are often hierarchically organized into smaller data structures, typically referred to as "cells." Thus, for a microprocessor or flash memory design, all of the transistors making up a memory circuit for storing a single bit may be categorized into a single "bit memory" cell. Rather than having to enumerate each transistor individually, the group of transistors making up a single-bit memory circuit can thus collectively be referred to and manipulated as a single unit. Similarly, the design data describing a larger 16-bit memory register circuit can be categorized into a single cell. This higher level "register cell" might then include sixteen bit memory cells, together with the design data describing other miscellaneous circuitry, such as an input/output circuit for transferring data into and out of each of the bit memory cells. Similarly, the design data describing a 128 kB memory array can then be concisely described as a combination of only 64,000 register cells, together with the design data describing its own miscellaneous circuitry, such as an input/output circuit for transferring data into and out of each of the register cells.

By categorizing microcircuit design data into hierarchical cells, large data structures can be processed more quickly and efficiently. For example, a circuit designer typically will analyze a design to ensure that each circuit feature described in the design complies with specified design rules. With the above example, instead of having to analyze each feature in the entire 128 kB memory array, a design rule check process can analyze the features in a single bit cell. If the cells are identical, then the results of the check will then be applicable to all of the single bit cells. Once it has confirmed that one instance of the single bit cells complies with the design rules, the design rule check process then can complete the analysis of a register cell simply by analyzing the features of its additional miscellaneous circuitry (which may itself be made of up one or more hierarchical cells). The results of this check will then be applicable to all of the register cells. Once it has confirmed that one instance of the register cells complies with the design rules, the design rule check software application can complete the analysis of the entire 128 kB memory array simply by analyzing the features of the additional miscellaneous circuitry in the memory array. Thus, the analysis of a large data structure can be compressed into the analyses of a relatively small number of cells making up the data structure.

In addition to employing hierarchy, design data may alternately or additionally be organized into layers of data. For example, with various embodiments of the invention, layout design data may include two different types of data: "drawn layer" design data and "derived layer" design data. As previously noted, physical design data or "layout" design data will represent the geometric elements that will be written onto a mask used to fabricate the desired microcircuit device in a photolithographic process at a foundry. The drawn layer data therefore will describe geometric elements that will be used to form structures in layers of material to produce the integrated circuit. The drawn layer data will usually include polygons that will be used to form structures in metal layers, diffusion layers, and polysilicon layers. The derived layers will then include geometric elements made up of combinations of drawn layer data and other derived layer data. Thus, with a transistor gate, derived layer design data describing the gate may be derived from the intersection of a polygon in the polysilicon material layer and a polygon in the diffusion material layer.

For example, a design rule check process performed by the design rule check module 309 typically will perform two types of operations: "check" operations that confirm whether design data values comply with specified parameters, and "derivation" operations that create derived layer data. A transistor gate design data thus may be created by the following derivation operation:

gate=diff AND poly

The results of this operation will be a "layer" of data identifying all intersections of diffusion layer polygons with polysilicon layer polygons. Likewise, a p-type transistor gate, formed by doping the diffusion layer with n-type material, is identified by the following derivation operation:

pgate=nwell AND gate

The results of this operation then will be another "layer" of data identifying all transistor gates (i.e., intersections of diffusion layer polygons with polysilicon layer polygons) where the polygons in the diffusion layer have been doped with n-type material.

A check operation performed by the design rule check module 309 will then define a parameter or a parameter range for a data design value. For example, a user may want to ensure that no metal wiring line is within a micron of another wiring line. This type of analysis may be performed by the following check operation:

external metal<1

The results of this operation will identify each polygon in the metal layer design data that are closer than one micron to another polygon in the metal layer design data.

Also, while the above operation employs drawn layer data, check operations may be performed on derived layer data as well. For example, if a user wanted to confirm that no transistor gate is located within one micron of another gate, the design rule check process might include the following check operation:

external gate<1

The results of this operation will identify all gate design data representing gates that are positioned less than one micron from another gate. It should be appreciated, however, that this check operation cannot be performed until a derivation operation identifying the gates from the drawn layer design data has been performed.

Models

To illustrate how a manufacturing model is developed, the well-known problem of photoresist wall collapse will now be discussed with reference to FIG. 4. As known in the art, with a sub-micron lithography manufacturing process the minimal spacing between metal wires 401A and 401B typically is smaller than the thickness of the photoresist used to form the wires 401. As a result, the processed photoresist forms a tall thin wall 403 that is prone to mechanical failure and collapse. Because the photoresist wall 403 separates the two metal wires 401 during their formation, its collapse will cause a short-circuit between the wires 401. While the accurate description of the wall collapse is still the subject of scientific research, several failure mechanisms have been identified and the overall dependency of the collapse probability on layout geometry is known. Collapse probability decreases rapidly when the wall 403, or the distance between the wires 401, increases. Collapse probability is also generally proportional to the length of the straight fragment of the photoresist wall 403. If the wall 403 is supported on both ends by wider areas 405 of photoresist, as is often the case, these areas act as "anchors" and provide additional stability to the wall 403 near its ends.

One approach to reducing photoresist wall collapse is to forbid any straight run of the two parallel wires 401 for lengths longer than a length $L_A$, the effective length of stabilization provided by the anchors 405. This prohibition can be accomplished using a simple rule implemented by a conventional design rule check process during the verification of microdevice design. Such a design constraint likely carries a very high area penalty, however, complicates the design, and makes the task of layout creation much more difficult.

Another approach to reducing photoresist wall collapse is to employ an analysis that penalizes long straight runs of the parallel wires 401 at the minimum spacing, and computes an overall yield score for this combination of design features based on their total length. This score then can be used to compare different design variants, assist a designer in selecting standardized designs with higher yields, or simply show a designer which areas of a layout are likely to cause yield problems. This analysis can be expressed in pseudocode as follows:

Long_Wall :=Parallel(Metal, space=$S_{min}$, length>$2L_A$)

Score :=$\Sigma$[Length(Long_Wall)]−$2L_A$ where the Parallel( ) operation selects design data representing the parallel metal wire fragments that satisfy spacing and length constraints, and the Length( ) operation measures the length of each of these wire fragments.

This simple analysis thus can be considered a very basic model of yield loss due to photoresist wall collapse. As will be seen from this example, a microdevice manufacturing model describing the interaction of some geometric elements in a layout design generally will include the geometric elements, a relationship between these geometric elements, one or more measurements based upon the geometric elements or their relationships, and a function, such as a mathematical function, defining the information to be provided by the model. Thus, in the previously-described example, the geometric elements were wires (i.e., polygonal geometric elements in a metal design layer) longer than the threshold length, and the relationship was that the wires are parallel and have no additional geometric elements between them. Design features meeting these requirements then are selected by the Parallel( ) operation.

Once the geometric elements relevant to a particular model have been identified, the metrics that serve as parameters for the manufacturing model need to be measured. Typically, these measurements will be of dimensions or spacing of layout geometries. In the previously discussed example, the measurements were of the length of the wire fragments selected by the Parallel( ) operation. These lengths were computed by the Length( ) operation. The equation (or equations) defining the model then expresses the desired characteristics of the design in terms of the computed measurement values. In the simple example discussed above, the function for the manufacturing model was the sum of all measured lengths, minus the "anchor stabilization correction" value of $2L_A$.

It is the use of this second model component, measurements, that primarily differentiates manufacturing models from conventional design-rule-check rules. Conventional design-rule-check rules are binary, in that the checked design feature either passes or fails the rule. The model-based approach, however, does not characterize individual measurements as passing or failing. Instead, the model produces an analog result, which can then be used to characterize the layout design.

Analog Design-Rule-Check Tool

Figure 5:
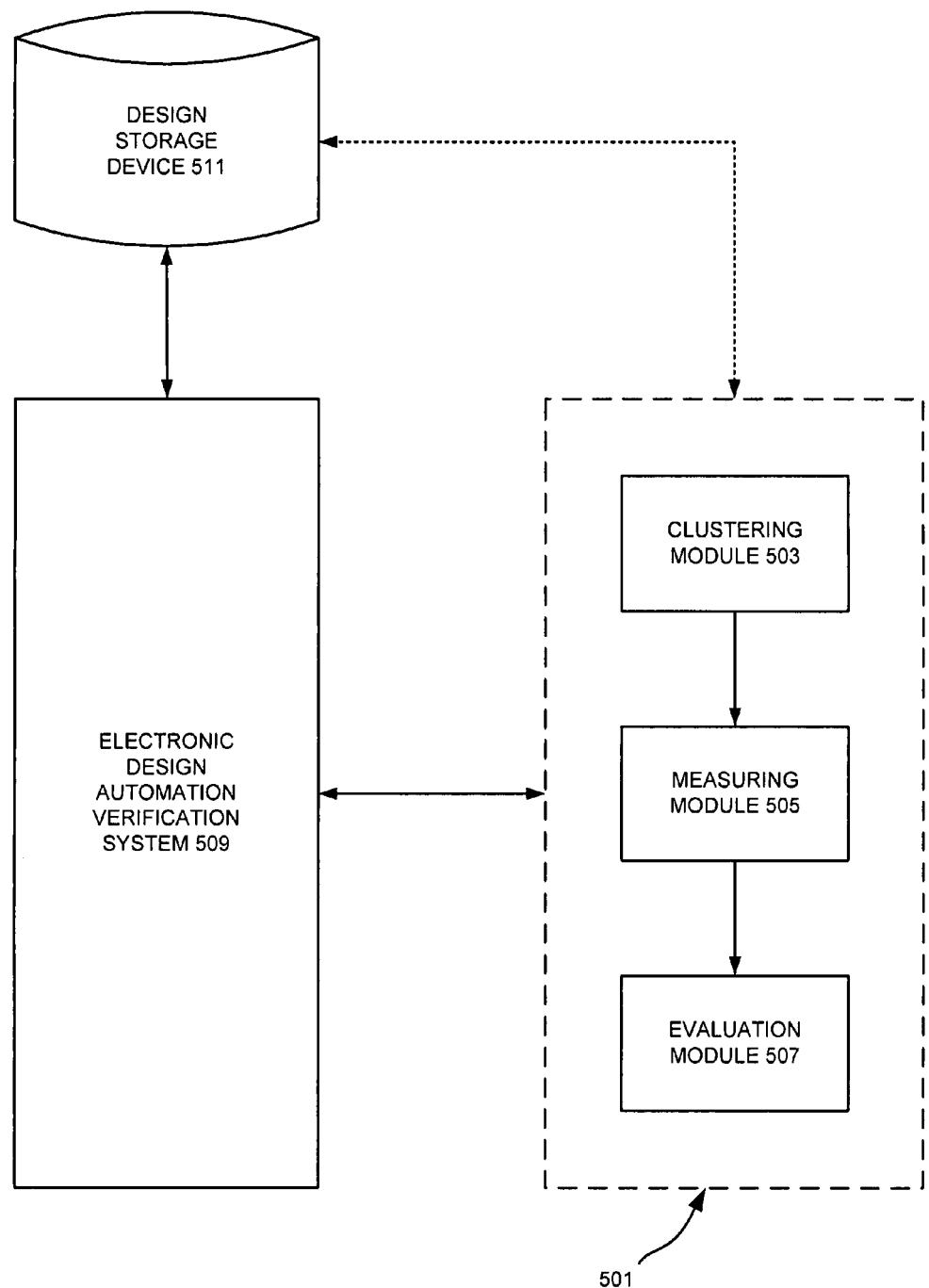
FIG. 5 illustrates an example of an analog design-rule-check tool that may be provided according to various embodiments of the invention.

FIG. 5 illustrates an example of a flexible analog design-rule-check tool 501 that may incorporate one or more aspects of the invention. As seen in this figure, the tool 501 includes a clustering module 503, a measuring module 505, and an evaluation module 507. As will be discussed in more detail below, the clustering module 503 identifies instances of a particular type of geometric element in a microdevice design. For each identified instance of the type of geometric element, the clustering module 503 determines if that instance shares a defined relationship with one or more instances of a another type of geometric element. If it does, then the clustering module 503 associates or "clusters" that instance of the first type of geometric element together with the identified instances of the second type of geometric element.

Once the clustering module 503 has associated various instances of geometric elements together into identifiable clusters, the measuring module 505 measures one or more values for each specified cluster. More particularly, for each specified instance of the first type of geometric element that was associated with one or more instances of the second type of geometric element, the measuring module 505 determines the value of one or more measurements using characteristics of the instance of the first type of geometric element. The evaluation module 507 then employs the values measured by the measuring module 505 to evaluate a desired model function.

Typically, the analog design-rule-check tool 501 will operate in conjunction with an electronic design automation verification system 509. The electronic design automation verification system 509 may incorporate any desired electronic design automation tool or set of tools. For example, the electronic design automation verification system 509 may incorporate a feature extraction tool, a layout-versus-schematic verification tool, a design-rule-check tool, an optical proximity correction tool, or some combination thereof.

In the illustrated example, the analog design-rule-check tool 501 is separate from the electronic design automation verification system 509. With alternate implementation of the invention, however, portions or all of the analog design-rule-check tool 501 may be incorporated into the electronic design automation verification system 509, or specific components of the electronic design automation verification system 509. Thus, an analog design-rule-check tool 501 according to various embodiments of the invention may be incorporated into a design-rule-check module like the design-rule-check module 309 discussed above. Alternately or additionally, an analog design-rule-check tool 501 according to various embodiments of the invention may be incorporated into a design-for-manufacturing module like the design-for-manufacturing module 311 also discussed above.

Using its electronic design automation tools, the electronic design automation verification system 509 can perform a variety of electronic design automation verification processes on microdevice designs, such as integrated circuit designs. The microdevice designs may be stored in the design storage device 511. The design storage device 511 typically will be implemented by a magnetic disc storage device, such as the type provided by a magnetic hard disc drive. Of course, the design storage device 511 may be alternately implemented by any other desired memory medium, including, for example, an optical disc storage medium, a flash or other solid state memory device, including a RAM or ROM memory device, or some combination of these devices. Further, while the design storage device 511 is shown as separate from the electronic design automation verification system 509 in FIG. 5, it should be appreciated that some or all of the design storage device 511 may be incorporated into the electronic design automation verification system 509.

It also should be noted that a flexible analog design-rule-check tool according to one or more embodiments of the invention, such as the flexible manufacture modeling tool 501, may be implemented by software instructions running on a programmable computer (such as the programmable computing system shown in FIGS. 1 and 2), by firmware, by hardware, or some combination thereof. Further, a flexible analog design-rule-check tool according to one or more embodiments of the invention, such as the flexible manufacture modeling tool 501, may be implemented by software instructions stored on a computer-readable medium for execution by a programmable computer (such as the programmable computing system shown in FIGS. 1 and 2).

While the flexible analog design-rule-check tool 501 shown in FIG. 5 illustrates each of the clustering module 503, the measuring module 505, and the evaluation module 507 as separate units, alternate embodiments of the invention may integrate some or all of these modules into one or two units, or further divide the functions of some or all of these modules among four or more units. For example, a single computing system may be used to sequentially implement each of the clustering module 503, the measuring module 505, and the evaluation module 507.

Implementing A Model

Figure 6A:
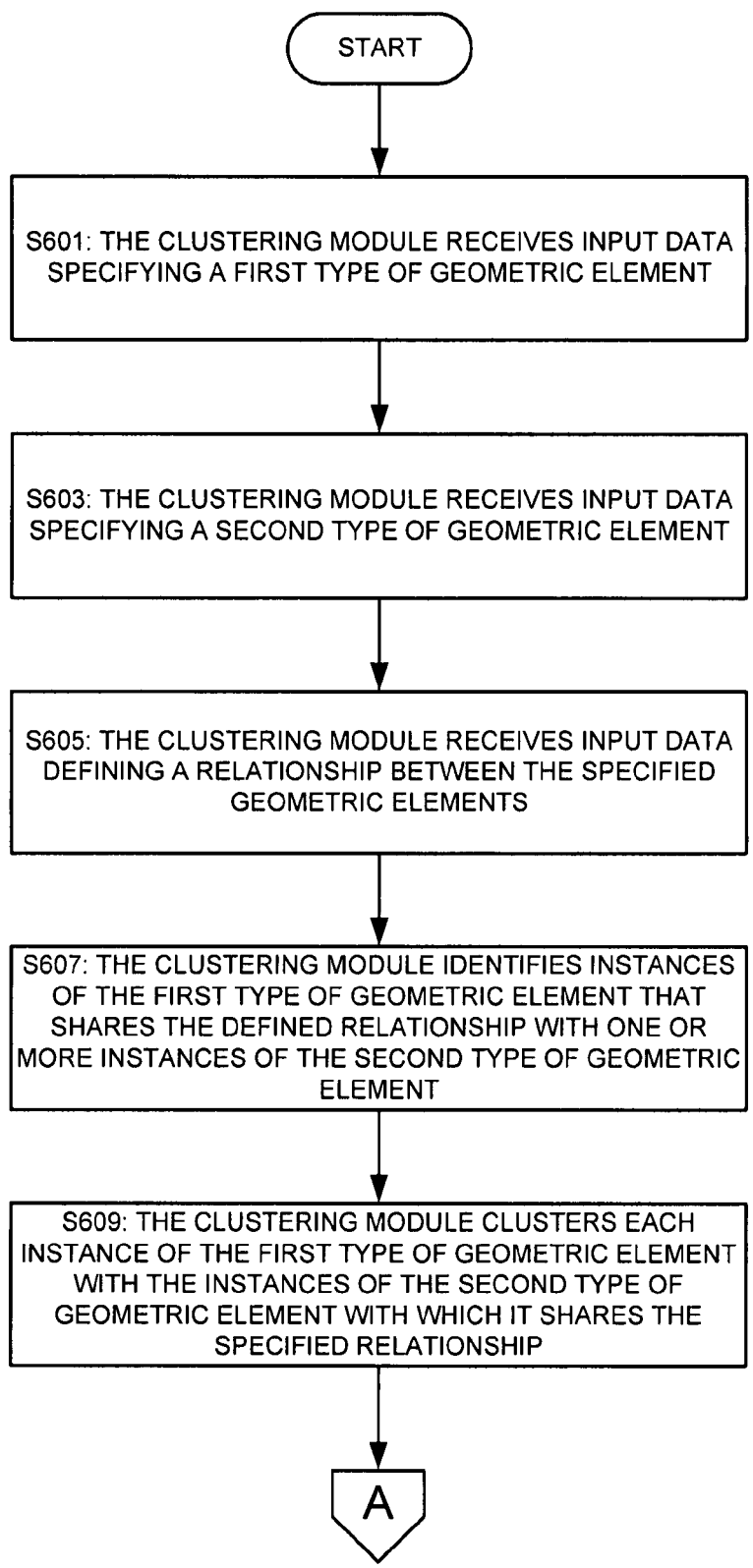
FIGS. 6A and 6B illustrate a flowchart showing a method of evaluation a model that may be employed according to various embodiments of the invention.
Figure 6B:
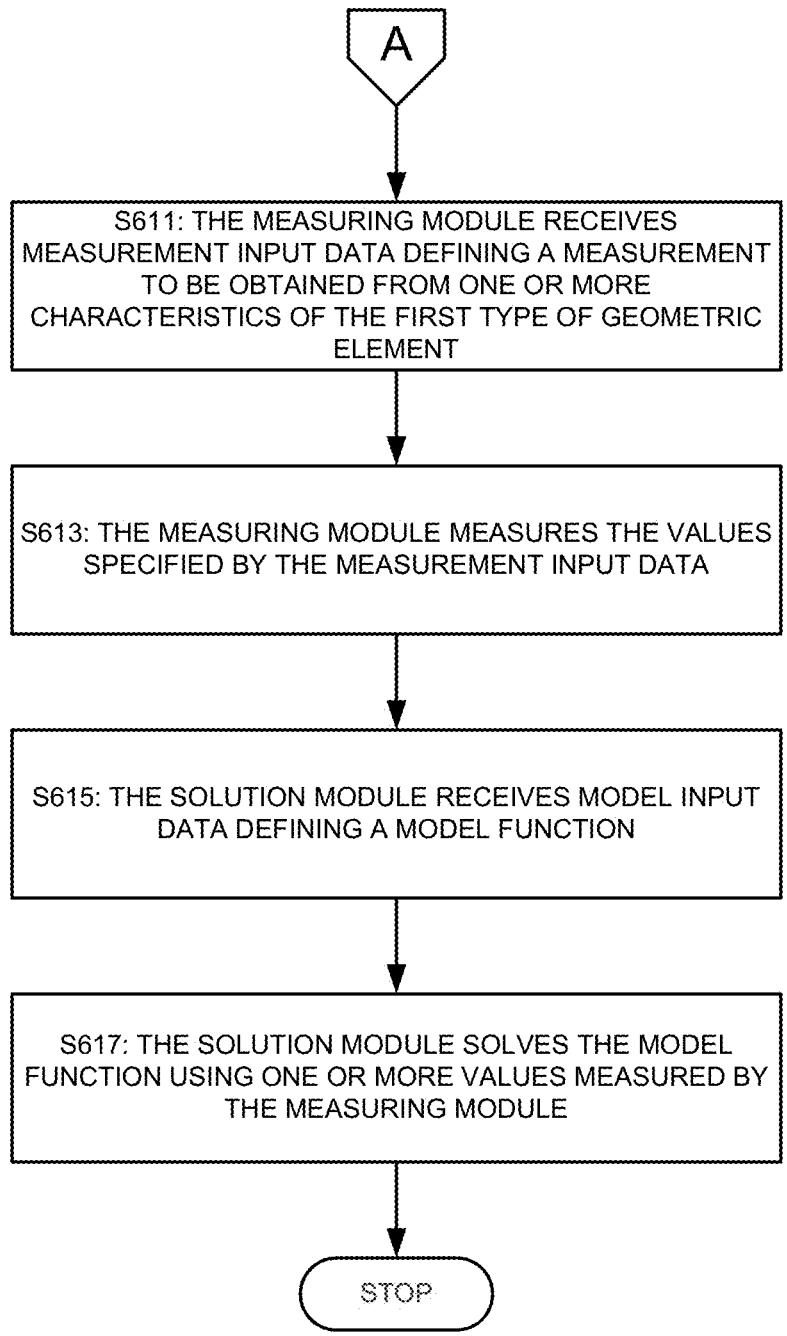

The operation of the flexible manufacture modeling tool 501 according to various examples of the invention will now be described with reference to the flowchart illustrated in FIGS. 6A and 6B. Initially, in step S601, the clustering module 503 receives input data specifying a first type of geometric element. This first type of geometric element may be a broad category of geometric elements, such as all polygons in a metal layer of a microdevice layout design. Alternately, the first type of geometric element may be a narrower subset of a broad category of geometric elements in a layout design, such as all polygons in a metal layer having a width greater than 0.2 microns, all polygons in a metal layer having a width greater than 0.2 microns and a length longer that 5 microns, or all edges in a metal layer having a length greater than 10 microns.

Next, in step S603, the clustering module 503 receives input data specifying a second type of geometric element. Like the first type of geometric element, the input data can define the second type of geometric element as a broad category of geometric elements, or a narrower subset of a broad category of geometric elements. In addition to the geometric elements that will be employed by the model, in step S605 the clustering module 503 receives input data defining a relationship between these geometric elements. That is, the clustering module 503 receives data specifying the relationship between geometric elements upon which the function of the model will be predicated. With various examples of the invention, this input information may be provided to the clustering module 503 via a scripting language. For example, a designer may create a series of design-rule-check rules for use by a conventional design-rule-check tool 309 in the electronic design automation verification system 509. These design-rule-check rules also may include "model rules" for instructing the flexible analog design-rule-check tool 501 to implement a model. As will be discussed in more detail below, these model rules may then include some or all of the input data specifying a first type of geometric element, a second type of geometric element, and a relationship between these types of geometric elements. Alternately, some or all of this information may be directly provided to the clustering module 503 through, for example, a graphical or command line user interface.

With some implementations of the invention, the relationship input data may specify a predefined relationship. For example, with some implementations of the invention, the flexible analog design-rule-check tool 501 may provide a set of predefined commands to identify geometric elements that intersect, overlap, or abut. Still further, the flexible analog design-rule-check tool 501 may provide commands that instruct the tool to identify when two different types of geometric elements will be electrically connected in the manufactured circuit (e.g., will be connected to the same net), or when they both fall inside of a bounding box. Still further, with some implementations of the invention, the analog design-rule-check tool 501 may allow a user to combine one or more of these predefined relationships.

Still other examples of the invention may alternately or additionally allow a user to define a desired relationship between occurrences of different types of geometric elements. By allowing a user the flexibility to define a desired type of relationship, these flexible analog design-rule-check tools permit the user to then implement a variety of models for assessing a microdevice design. For example, a user may wish to employ a new or proprietary model predicated upon a particular relationship between geometric elements in a layout design. The user can employ a flexible analog design-rule-check tool according to the invention to define the relationship required by the model, and then identify instances of geometric features sharing this relationship. Various implementations of the invention may allow a user to define a new relationship via, e.g., an application programming interface. Thus, the relationship input data can additionally include information for instructing the flexible analog design-rule-check tool 501 to identify different types of geometric elements based upon a newly-defined relationship shared by those geometric elements.

Returning now to FIG. 6A, in step S607, the clustering module 503 identifies instances of the first type of geometric element in a microdevice layout design. Next, in step S609, the clustering module 503 identifies instances of the first type of geometric element that shares the defined relationship with one or more instances of the second type of geometric element. More particularly, for each identified instance of the first type of geometric element, the clustering module 503 determines if that instance shares the specified relationship with one or more instances of the second type of geometric element. If it does, then, in step S611, the clustering module 503 clusters that instance of the first type of geometric element with the instances of the second type of geometric element with which it shares the specified relationship. That is, the clustering module 503 associates the instance of the first type of geometric element with those instances of the second type of geometric element with which it shares the specified relationship.

The clustering module 503 may, for example, create a cluster data object listing the instance of the first type of geometric element and each instance of the second type of geometric element with which it shares the specified relationship. The clustering module 503 may then append or otherwise add the cluster data object to the microdevice layout design. With some implementations of the invention, the cluster data object may be a single, unified data object. Thus, the cluster data object may be a table identifying each geometric element included in the cluster. Alternately or additionally, the cluster data object may comprise distributed data. For example, the flexible analog design-rule-check tool 501 may assign a common number to each geometric element in a cluster. The components of a single cluster then can be uniquely distinguished from other geometric elements in the layout design by this shared number. Of course, any other desired mechanism for uniquely identifying the contents of a cluster can be employed for still other embodiments of the invention.

It should be noted that, in some circumstances, only portions of the instances of the second type of geometric element will share the specified relationship with the instance of the first type of geometric element. For example, the first type of geometric element may be thin polygons in a metal layer (e.g., polygons having a width less than 0.2 microns), while the second type of geometric element may be polygons in an active layer. If the specified relationship is an overlap, then only a portion of a thin metal polygon may overlap a polygon in an active layer. With some implementations of the invention, the cluster data object (or other mechanism used to associate the instance of the first type of geometric element with the related instances of the second type of geometric element) may identify those portions of the geometric elements that share the specified relationship, or, with still other implementations of the invention, include only those portions of the geometric elements that share the specified relationship. Thus, with the previous example, a cluster data object may additionally identify the portion of a thin polygon in a metal layer that overlaps a polygon in an active layer or, alternately, include only the portion of a thin polygon in a metal layer that overlaps a polygon in an active layer.

It also should be noted that, with some implementations of the invention, the clustering module 503 may analyze the microdevice design to identify instances of the first type of geometric element and related instances of the second type of geometric element. With still other implementations of the invention, however, the clustering module 503 may employ an external mechanism to analyze the microdevice design. Thus, with the example shown in FIG. 5, the clustering module 503 may task the analysis process to, e.g., a feature extraction tool provided by the electronic design automation verification system 509.

Next, in step S611, the measuring module 505 receives measurement input data defining a measurement to be obtained from one or more characteristics of the first type of geometric element or the second type of geometric element. Then, in step S613, the measuring module 505 measures values for specified clusters based upon the measurement input data. That is, for each specified cluster of related geometric elements, the measuring module 505 determining a value of the measurement or measurements based upon the instance of the geometric elements in the cluster. Thus, with the previous example, the measurement data may specify measurement of the width of the first type of geometric element. In response, the measuring module 505 will measure the width of each specified metal polygon that overlaps a polygon in an active layer. Similarly, the measurement data may specify measurement of the length of the second type of geometric element. In response, the measuring module 505 will measure the length of each specified active polygon that is overlapped by a thin polygon in a metal layer.

Typically, the measuring module 505 will determine a value of the measurement for each relevant cluster created by the clustering module. With various implementations of the invention, however, the designer may specify that the measuring module 505 determine a value of the measurement for only particular clusters. For example, a user may specify that the measuring module 505 determine a value of the measurement for only those clusters that fall within particular region of the layout design, are involved with a particular logical net, or share some other attribute. Thus, while various implementations may select all of the clusters created for a model as specified clusters by default, they may also allow a user to specify only a subset of these clusters for measurement by the measuring module 505.

It also should be appreciated that one or more of the measurements may be based upon characteristics determined solely by the instance of the first type of geometric element or the second type of geometric element. For example, as previously noted, the measurement data may specify measurement of, e.g., the width of the first type of geometric element. Alternately, one or more of the measurements may be based upon characteristics determined by the relationship between the instance of the first type of geometric element and the instances of the second type of geometric element with which it is associated. Thus, with the previously-discussed example, the measurement data may specify measurement of the area of each thin polygon in a metal layer that overlaps with a polygon in the active layer. Accordingly, rather than measuring the entire area of a thin metal polygon, the measuring module 505 will only measure the area of a thin polygon in a metal layer that actually overlaps a polygon in an active layer.

Still further, various implementations of the invention may allow a designer to provide measurement data designating multiple measurements for each specified cluster. Thus, with the previous example, a user may provide measure data instructing the measurement module 505 to measure both the width of the thin metal polygon and the area of overlap between the thin metal polygon and the polygon in the active layer for each specified cluster.

With various implementations of the invention, the measuring module 505 may simply store the measured values so that they can be subsequently associated with their corresponding clusters. Still other implementations of the invention, however, may save one or more of the measured values for a cluster in a property data object annotated to a geometric element in the cluster (e.g., the instance of the first type of geometric element in the cluster). In this manner, the measured value or value can be, for example, provided to another electronic design automation process via the property data object. The use of such property data object are discussed in detail in each of the following related patent applications: (1) U.S. Provisional Patent Application No. 60/850,716, entitled "Properties In Electronic Design Automation," filed on Oct. 9, 2006, and naming Fedor Pikus as inventor; (2) U.S. patent application Ser. No. 11/869,717, entitled "Properties In Electronic Design Automation," filed on Oct. 9, 2007, and naming Fedor G. Pikus et al. as inventors; (3) U.S. patent application Ser. No. 11/869,720, entitled "Properties In Electronic Design Automation," filed on Oct. 9, 2007, and naming Fedor G. Pikus et al. as inventors; (4) U.S. patent application Ser. No. 11/869,726, entitled "Properties In Electronic Design Automation," filed on Oct. 9, 2007, and naming Fedor G. Pikus as inventor; and (5) U.S. patent application Ser. No. 11/869,731, entitled "Properties In Electronic Design Automation," filed on Oct. 9, 2007, and naming Fedor G. Pikus as inventor, each of which applications is incorporated entirely herein by reference.

Like the clustering module 503, with some implementations of the invention the measuring module 505 may analyze the microdevice design to determine the required measurement values. With still other implementations of the invention, however, the measuring module 505 may employ an external mechanism to analyze the microdevice design. Thus, with the example shown in FIG. 5, the clustering module 503 may obtain the measured values through, e.g., a feature extraction tool provided by the electronic design automation verification system 509.

Next, in step S615, the evaluation module 507 receives model input data defining a model function. Again, the model input data can be provided in a scripting language via, e.g., the electronic design automation verification system 509, or directly through a user interface. In step S617, the evaluation module 507 evaluates the model function using one or more values measured by the measuring module 505. With some implementations of the invention, the model function may employ the measured values for a plurality of the specified clusters in the microdevice design. For example, evaluation of the model function may require the use of the measured values for every specified cluster in a particular region of the layout design, or even for every specified cluster. Alternately, the model function may be separately evaluated for each of a plurality of specified clusters in the microdevice layout design.

For example, as previously noted, a measured value may be the area of overlap between a thin polygon in a metal layer and one or more polygons in an active layer. The model function then may be the total area of overlap in the microdevice design (i.e., the sum of the measured area for each specified cluster). Alternately, the model function may be, e.g., a multiplicand of the overlap area for a single cluster. With this model function, the evaluation module 507 may make a separate model evaluation for each specified cluster in the microdevice design.

It should be appreciated that, according to various examples of the invention, the model function may be a mathematical function, a non-mathematical function, or some combination of the two. For example, a model may be a pure mathematical function, such as an average of the measured values. Alternately, a model may be defined by a non-mathematical function, such as a Monte-Carlo simulation using the measured values. Still further, the model may be a hybrid function, such as a Monte-Carlo simulation using averages of the measured values.

It also should be appreciated that, with various examples of the invention, one or more of the above described steps may be repeated, omitted, or reordered. For example, with various implementations of the invention, the input data specifying the first type of geometric element, the input data specifying the second type of geometric element, the relationship data, the measurement data and the model definition data may all be provided at the same time. Alternately, the measurement data and/or the model definition data may be provided, e.g., after the clustering module 505 has identified the relevant clusters.

Still further, the steps of receiving input data specifying a second type of geometric element and forming a corresponding cluster may be repeated for three or more different types of geometric elements. That is, in addition to specifying a cluster based upon a relationship between two different types of geometric elements, various implementations of the invention may allow a user to create clusters based upon relationships between three or more different types of geometric elements. For example, after the clustering module has created clusters based upon a relationship between two different types of geometric element, a user may provide additional input data specifying a third type of geometric element, as well as additional data specifying a second type of relationship. The clustering module 505 will then identify instances of this third type of geometric element that share this additional relationship with an existing cluster, and add those instances of the third type of geometric element to that cluster. Various implementations of the invention may allow this "multiclustering" to be made for as many different types of geometric elements and associated relations as desired by a user.

Still further, some implementations of the invention may allow a user to omit the creation of clusters altogether, and obtain measurement values relating to instances of only a single type of geometric element without requiring that a user specify a relationship or a second type of geometric element. With these implementations, the evaluation module 507 can evaluate a model using measurements based solely upon instances of the first type geometric element.

Scripts

As previously noted, various implementations of the invention may allow a user to specify types of geometric elements and their relationship using scripts, such as the following script syntax:

primary_layer [secondary_layer . . . ] RELATION-
        SHIP [property_definition . . . ]

where property_definition is
        '['property_name=expression']' [['!']
        constraint] . . .

With this example, the operation primary_layer specifies a layer of data (either drawn or derived, as discussed in detail above) in a layout design. The clustering module 503 will then identify geometric elements from this layer that meet the criteria specified for this operation. As previously noted, the geometric elements in this layer can be polygons, edges, or groups of edges. Similarly, if the operation secondary_layers is employed, this operation instructs the clustering module 503 to create associations between the specified geometric elements in for the secondary_layer and those designated for the primary_layer, by, e.g., grouping them together into clusters as discussed in detail above. With various examples of the invention, each cluster will contain exactly one instance of the first type of geometric element in the primary_layer, and an arbitrary number of instances of the second type of geometric elements in the specified secondary_layer. As previously noted, various implementations of the invention may allow a user to specify any number of secondary layers for multiclustering.

As previously noted, some implementations of the invention may provide a variety of predefined relationships that can be employed by a user to cluster occurrences of different types of geometric elements. These predefined relationships may include, for example, intersect, overlap, abut, electrically connected, and within a bounding box. For example, with some implementations of the invention, a cluster based upon the "intersections" relationship may be defined as, e.g., polygon on the primary layer, plus all polygons in the secondary layer that overlap that polygon in the primary layer. The polygons in the secondary layer that partially overlap the polygon in the primary layer are clipped by the polygon in the primary layer, so that only the portions that overlap the polygon in the primary layer are used by the measuring module for determining the specified measurement values.

On the other hand, a cluster based upon the "overlap" relationship may be defined as a geometric element in the primary layer plus all geometric elements in a specified secondary layer with which it has a non-zero area of overlap. With the "overlap" relationship, the geometric elements in the secondary layer of the layout design that partially overlap the geometric element in the primary layer are not clipped.

Some examples of the invention may allow a user to modify the parameters of a relationship. For example, various implementations of the invention may allow a user to modify the "overlap" relationship by employing an "ABUT ALSO" command, a "MULTI" command, or a "REGION" command. With these implementations, the ABUT ALSO command instructs the clustering module 503 to include geometric elements in the secondary layer layout that abut the geometric element in the primary layer, as well as those that overlap it, in the cluster. The MULTI and NOMULTI commands may then controls whether the "overlap" relationship includes a geometric element on the secondary layer that overlaps or abuts more than one geometric element in the primary layer. When the MULTI command is used, for example, the clustering module 503 will assigns such a geometric element in the secondary layer to a cluster for each geometric element in the primary layer it overlaps or abuts. When this command is not present, the clustering module 503 assigns such a geometric element to one of the relevant clusters arbitrarily.

When the "REGION" is employed, it controls how the clustering module 503 treats edges for the purpose of forming clusters, to provide a more flexible interpretation of the "overlap" relationship. If this command is not employed, only the overlap of edges will be added to a cluster. When it is employed, the clustering module 503 will treat the edges as if they formed polygons. For example, a geometric element with two parallel edges will treated as if they formed trapezoids with vertices located in the endpoints of the edges. Other groups of edges then may be treated as if they were a polygon formed by their extents.

If the "connected" relationship is employed, only geometric elements on secondary layers that belong to the same net as the geometric element on the primary layer are clustered with that geometric element in the primary layer. If, on the other hand, the relationship "not connected" is specified, only geometric elements in the secondary layers that do not belong to the same net as the geometric element in the primary layer are clustered with that geometry. If either of these relationships is specified in conjunction with another relationship, such as intersection or overlap, then the requirements specified by those other relationships must still be met to form a cluster.

The relationship "inside of" instructs the clustering module 503 to cluster geometric elements that have at least a partial overlap with the rectangular window specified by the arguments of the corresponding command. That is, a geometric element is said to overlap with an "inside of" window if any part of the extent of the geometric element overlaps the window area. The arguments of the "inside of" relationship, which may be pairs of x and y coordinate vertices values, may be specified in chip-level coordinates. With some embodiments of the invention, multiple "inside of" relationships can be specified, defining multiple selection windows.

Returning now to the script property_definition, the format for a property_definition may be:

'['property_name=expression']' [['!'] constraint] . . .
        where:

a property_name is the argument defining the property name, and the expression is an optional expression used to calculate the value of the property. While the property name may be any arbitrary string, names including the characters "−" and "+" may have a limited role. For example, these properties may computed and checked against constraints, but not stored. This type of property, referred to as a nonpersistent property, is used to filter the input layer when satisfying the constraint is important, but the exact value is not. With various examples of the invention, the analog design-rule-check tool 501 may be capable of evaluating expressions using its own mathematical language, a built-in expression language such as Tcl, an API for dynamic libraries, or through any other desired means.

One example of the use of this type of scripting language is shown by the following command:
X=A B C [ARATIO=AREA(B)/AREA(C)] [−=AREA(A)]>=100

From the forgoing discussion, it will be appreciated that this command selects all polygons on layer A whose area is no less that 100 in user units. For each of these polygons, the computed property is the ratio of areas of polygons on layers B and C inside the polygon on layer A. This property is stored with every polygon on output layer X, and the property name is "ARATIO". The Area property "−" is used in constraint checking, but is not stored with the property value.

Examples of Uses of Models

Figure 4:
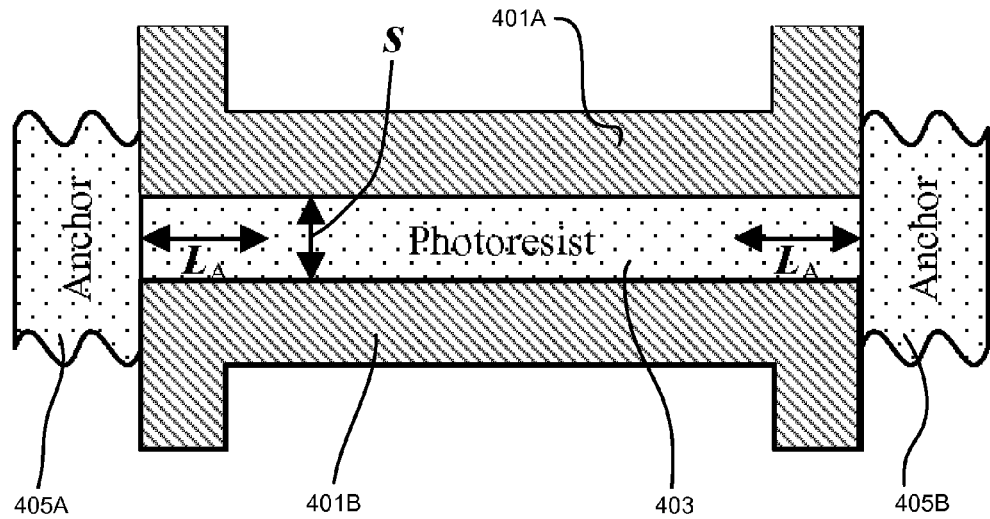
FIGS. 4 and 7 illustrate examples of the interaction of geometric elements in a microcircuit layout design that may be modeled according to various embodiments of the invention.

While the model discussed with reference to FIG. 4 is unlikely to be sufficiently accurate, it serves to illustrate how it can be useful to develop and program by a model into a DRC or DFM tool instead of having the model hard-coded into the tool. Referring now to Fig. A more useful model, which takes into account the width of the photoresist wall S, as well as considers other layout features which serve to stabilize or weaken the photoresist, such as corners which stabilize the wall for some distance near the feature, will now be discussed with regard to FIG. 7.

From the above discussion, it will be appreciated that a flexible analog design-rule-check tools according to various implementations of the invention can locate a variety of geometric elements relevant to the illustrated structure, so a more complex model, expressed in the same pseudo-code, may be used as follows:

Long_Wall :=Parallel(Metal, space<=$S_{max}$, length>=$L_{min}$)

Corners :=Corners(Metal, space<=$S_{max}$)

T_Intersections :=T Intersections(Metal, space<=$S_{max}$)

Anchors :=EndPoints(Metal, space<=$S_{max}$)

Wall_Fragment :=Feature_Count(Long_Wall, Corners, T_Intersections, Anchors)

Figure 7:
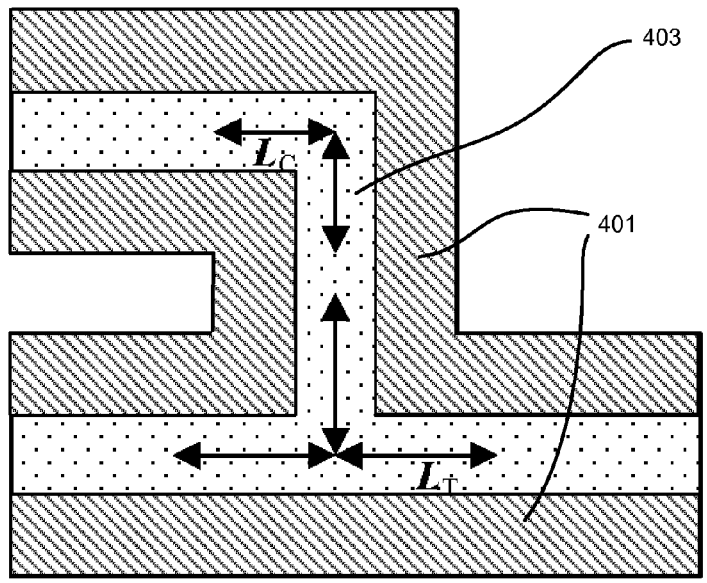

Score :=$\Sigma F$(Length(Wall_Fragment), $L_1$, $L_2$)

where Corners and T_Intersections are operations that identify wall corners and intersections as shown in FIG. 7. Other relevant features can be similarly added to the model as desired. To reduce the amount of geometric data which has to be processed by the model, the operations are restricted to identify only features where the wire spacing does not exceed the maximum value $S_{max}$ beyond which the probability of wall collapse is negligible, and the wire length exceed the threshold $L_{min}$ which can be assumed to be the length of the shortest wall still prone to collapse. The operation Feature_Count annotates each Long_Wall fragment with counts of corners, t-intersections, and anchors that terminate the fragment. These counts are later used by the model function F to compute the wall strength of each wall fragment. In addition to the measured fragment length, this function uses two characteristic lengths $L_1$ and $L_2$ which correspond to the two features terminating the fragment. For example, if the fragment is anchored on one end and has a corner on the other end, $L_1$ and $L_2$ are $L_A$ and Lc, shown in FIG. 7, respectively.

Because of the flexibility of the model creation provided by various implementations of the invention, if the designer, though the process of model calibration and verification, discovers that the model is missing some layout features which should be taken into account, or distinguish between features which were previously treated in the same way, the designer can describe the appropriate features using various operations and add their measurements to the model equations. For example, if it turns out that 4-way intersections must be treated differently from t-intersections, and have a different characteristic length, $L_1$, then the analog design-rule-check tool 501 can easily be provided a new model extended to handle such features, as follows:

Intersections :=Intersections(Metal, space<=$S_{max}$)

Wall_Fragment :=Feature_Count(Long_Wall, Corners, T_Intersections, Intersections, Anchors)

Score :=$\Sigma F$(Length(Wall_Fragment), $L_1$, $L_2$)

Where Intersections is an operation that identifies 4-way intersections in a photoresist wall, and the length parameters $L_1$ and $L_2$ are selected from $L_A$, Lc, $L_T$, and $L_I$ based on the feature counts for each wall fragment.

Another example of how various implementations of the invention may be used to evaluate a model will now be discussed with regard to a different domain, an advance device characterization model that describes the effects of stress on the MOSFET properties in strained silicon structures. While the basic physics of electron transport in strained silicon is well understood, calculating stress in actual MOSFET structures is a difficult challenge that conventionally is handled with a number of approximate models. Just like the yield model discussed above, various strained MOSFET models are currently being developed and evaluated, which complicates implementing a fully integrated modeling solution but makes this a good application for a flexible analog design-rule-check tool 501 according to various implementations of the invention.

Figure 8:
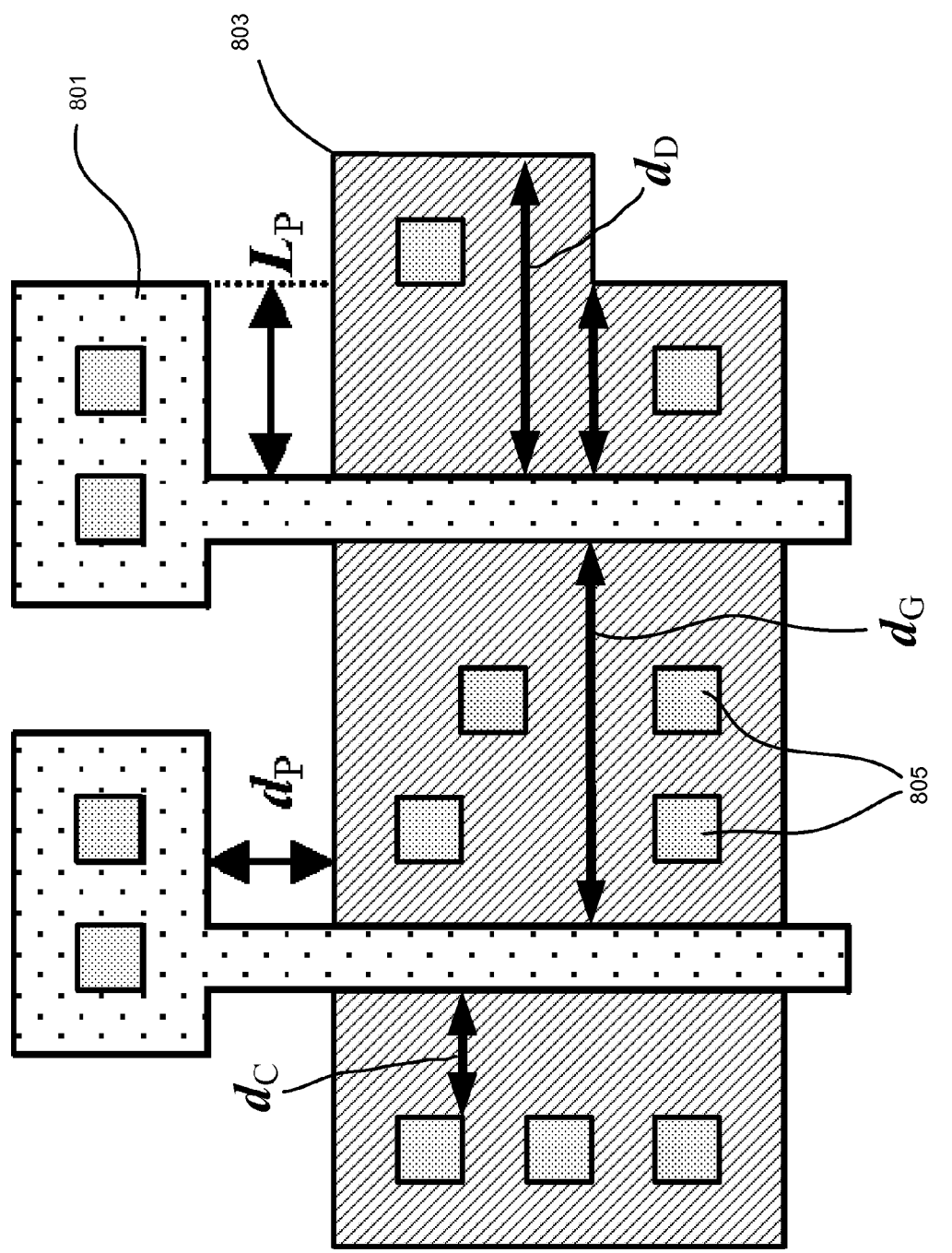
FIG. 8 illustrates a sample layout of a MOS device that may be modeled according to various embodiments of the invention.

FIG. 8 illustrates a sample layout of a MOS device showing some of the features which determine the stress in the gate area (the models currently considered for practical implementation take into account not only polysilicon layer material 801 and diffusion layer material 803, but also wells and other device-enclosing structures, as well as adjacent devices).

Any stress-effect model should have the expressions for gate strain and strain-depended device parameters as a function of the environment; these functions form the third component of the model as described above. In order to apply these expressions to a device, the relevant geometric features must first be identified, such as, for example, adjacent gates and contacts 805. After MOSFET gates are identified, for example, as polysilicon rectangles over the diffusion areas, the first component of the model, i.e., layout features of interest, can be identified as follows:

Gate Side :=Coincident Edge(Gate, Diffusion)

Diffusion Boundary :=Opposite_Edge(Gate, Diffusion)

Device_Contact :=Enclosure(Contact, Diffusion)

Poly_Pad :=Parallel(Gate, Diffusion)

(and similar operations) where Coincident_Edge and Opposite_Edge are operations that identify edges of diffusion polygons which are coincident with gate rectangles and opposite to them, respectively, and Enclosure is an operation that finds all contacts enclosed by the source-drain diffusion areas.

The remaining component of the model is the measurements. Since all measurements in the end are used to compute device parameters, the device geometries can be annotated with the appropriate measurement values as follows:

Device_Gate :=Distances(Gate_Side, Device_Contact, Diffusion_Boundary)

Device_Diffusion :=Length(Diffusion, Poly_Pad)

Device_Diffusion+=Distance(Diffusion, Poly_Pad)

where the Distances( ) function computes distances between the sides of the gate and the contacts $d_C$, and also distances to the opposite boundary of the diffusion region $d_D$. These values are annotated onto Device_Gate geometries. Similarly, the functions Distance( ) and Length( ) compute the separation between the parallel edges of the diffusion and the gate contact pad $d_P$ and the length of these edges $L_P$ and annotates them onto Device_Diffusion geometries. The "+=" characters express that one more annotation is added to the geometries. Note that for some devices, the measurements may take multiple values, For example, in FIG. 8 there are two values of $d_D$ for the rightmost device. Depending on the model, the designer may be interested in the smallest or the average value, or in all values. The annotation mechanism which attaches measurement values to layout geometries should be sufficiently flexible to handle multiple measurements, and the model programming language of the analog design-rule-check tool 501 should support all necessary mathematical operations, like minimum or average.

With all measurements computed and annotated onto device geometries, the last component of the model can now be implemented MOS :=Device(Device_Gate, Device_Diffusion;
$P=F(d_C, d_D, d_P, L_P)$)

where Device is the device detection and characterization operation that forms the MOS devices from Device_Gate and Device_Diffusion geometries. It uses the model function F, which converts all the device measurements $d_C$, $d_D$, $d_P$, and $L_P$ into the model parameter P which can be written out, for example, as a SPICE device parameter and used by a simulation tool.

Unlike a strained MOSFET model which is embedded in a simulation tool, the programmable model allowed by various implementations of the invention is easy to extend and customize. For example, if, in order to improve the accuracy of the model or handle some special case, it is necessary to determine the total count of device contacts Nc, it is only necessary to annotate one more parameters onto the device geometries as follows:

Device_Diffusion+=Count(Diffusion, Device_Contact)

MOS :=Device(Device_Gate, Device_Diffusion;
$P=F(d_C, d_D, d_P, L_P, Nc)$).

Yet another class of models that can be employed with various implementations of the invention is that of empirical models that are created to describe some "in-house" design characteristics specific to the particular manufacturing process or design methodology. For example, a designer may employ a model which, given a yield-reducing feature identified by a DRC or DFM tool, attempts to predict how easy it would be for the designer to fix the problem and eliminate this cause of yield loss. This model can be used to rate all identified DFM problems by their "ease of fixing," and present to the designer only the problems which he can fix in a reasonable amount of time.

Figure 9:
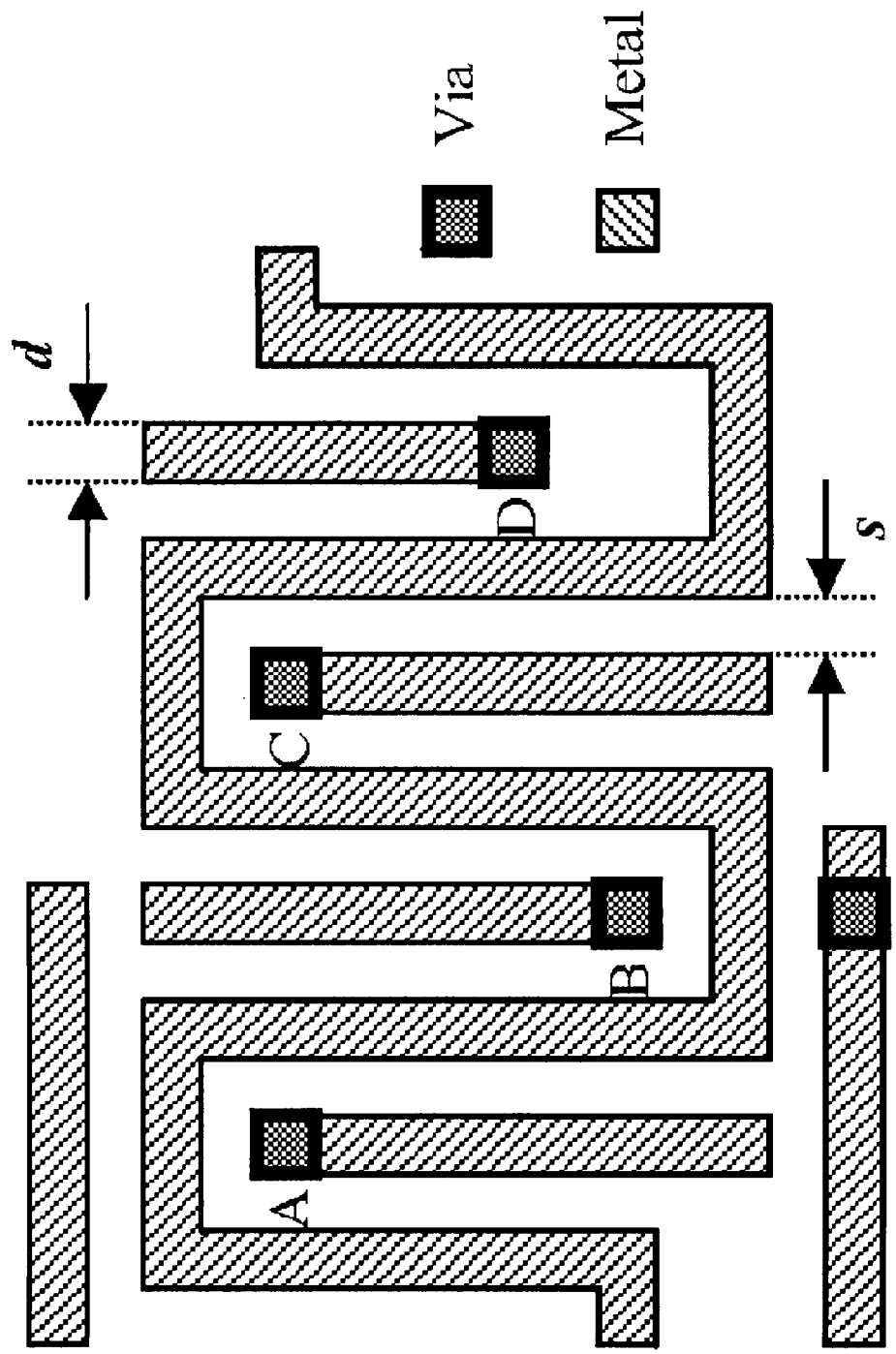
FIG. 9 illustrates an end-of-line via enclosure yield problem that may be modeled according to various embodiments of the invention.

An example of one possible yield problem, the end-of-line via enclosure, is illustrated in FIG. 9. As seen in this figure, a design includes several vias that can be improved by extending the end of metal wire past the via. Minimum wire spacing rules cannot be violated, however, when attempting to extend the via enclosures. A flexible analog design-rule-check tool according to various implementations of the invention can identify all vias with small enclosures, but it is neither practical nor necessary to fix all of them. Instead, a designer will typically focus on the vias that can be fixed easily to make the most efficient use of valuable design time. The flexible analog design-rule-check tool, therefore, will be configured to rate all vias which can benefit from improvement and select those that are most likely to be fixable. This is necessarily an empirical model, since it attempts to predict how easy or hard would it be for a human to change certain layout feature Considering the vias in FIG. 9, it can easily be observed that the vias which have a lot of space between the end of the wire and adjacent wires are easy to improve. For a more accurate model, the extended neighborhood of the via may be taken into account. As seen in this figure, via D is the easiest to improve, since its wire can be extended without affecting any other wires (assuming that the vias themselves cannot be moved). Via C can be improved only if the wire above it is moved, and via A is even harder to improve since it requires moving two wires to avoid a DRC violation. Finally, via B cannot be improved at all without moving another via.

The first step in creating the improvability model is to identify all layout features that affect the ease of fixing the via enclosures. For a simple score which only checks whether a via can be improved without moving any wires, the nearest wire to each end of line should be found, as follows:

End of Line :=Coincident Edge(Via, Wire::length>d)

Opposite_Wire :=Opposite(End_of_Line, Metal,
space<=$S_{max}$)

where the Coincident_Edge operation finds all via edges coincident with metal edges longer than the via size d and the operation Opposite finds all wires opposite to the end-of-line via edges within the given search distance $S_{max}$. Now the relevant features for each via can be counted and measureed to compute its improvability score as follows:

Via_Score :=Min Distance(Via, Opposite_Wire)–
($d_{enc}+S_{min}$)

This score is equal to 0 if the line cannot be extended because there is an opposing metal wire at the minimum DRC spacing. Otherwise, the score increases if there is more room to improve the via enclosure. Vias annotated with this score can be shown to the designer in order starting from the highest score. If moving wires is a possibility, the score can be augmented with the count of opposing wires which would need to be moved before there is enough room for extending the end-of-line enclosure Conclusion While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

What is claimed is:

1. A method of processing microdevice layout design data, comprising:
    with a computer, analyzing microdevice layout design data
        to identify instances of a first type of geometric element,
        identify instances of a second type of geometric element,
        and for identified instances of the first type of geometric element,
            determine if the identified instance of the first type of geometric element shares the defined relationship with one or more instances of the second type of geometric element, and when the instance of the first type of geometric element shares a defined relationship with one or more instances of the second type of geometric element in the microdevice layout design data, then creating a cluster data object associating the instance of the first type of geometric element with the one or more instances of the second type of geometric element.

2. The method recited in claim 1, further comprising receiving measurement input data defining a measurement obtained from one or more characteristics of the first type of geometric element or the second type of geometric element; and
for a cluster data object, determining a value of the measurement from one or more instances of the geometric elements in the cluster data object.

3. The method recited in claim 1, wherein the relationship is selected from the group consisting of: intersecting, overlapping, abutting, electrically connected, inside of a bounding box, and a combination thereof.

4. The method recited in claim 1, wherein:
the first type of geometric element is occurrences of a category of geometric elements having one or more specified attributes, or
the second type of geometric element is occurrences of a category of geometric elements having one or more specified attributes.

5. The method recited in claim 1, further comprising:
receiving third feature input data identifying a third type of geometric element in the layout design data;
receiving second relationship input data defining a relationship between occurrences of the first type of geometric element and the third type of geometric element, or between occurrences of the second type of geometric element and the third type of geometric element;
analyzing microdevice layout design data to
identify instances of the third type of geometric element, and
for identified instances of the third type of geometric element,
determine if the identified instance of the third type of geometric element shares the defined relationship with one or more instances of geometric elements included in a cluster data object, and
if the instance of the third type of geometric element shares the defined relationship with one or more instances of geometric element in the cluster data object, then associate the instance of the third type of geometric element with the cluster data object.

6. A computer-readable storage medium having stored thereon a set of program instructions that are executable by a computer to perform the method recited in claim 1.

7. A method of verifying a microdevice layout design, comprising:
with a computer, analyzing a microdevice layout design to identify instances of a first type of geometric element;
for identified instances of the first type of geometric element,
determining if the instance of the first type of geometric element shares a defined relationship with one or more instances of a second type of geometric element occurring in the microdevice layout design, and
if the instance of the first type of geometric element shares the defined relationship with one or more instances of the second type of geometric element, then associating the instance of the first type of geometric element with the one or more instances of the second type of geometric element;
for a specified instance of the first type of geometric element associated with one or more instances of the second type of geometric element, using a computer to determine a value of a measurement using one or more characteristics of the specified instance of the first type of geometric element or one or more instances of the second type of geometric element associated therewith;
using a computer to evaluate a model function using the value of the measurement determined for the specified instance of the first type of geometric element; and
characterizing the microdevice layout design based upon the evaluation of the model function.

8. The method recited in claim 7, further comprising, for the specified instance of the first type of geometric element, adding a property data object to the microdevice layout design affiliating the determined value with the specified instance of the first type of geometric element.

9. The method recited in claim 7, further comprising, for the specified instance of the first type of geometric element, determining a value of a second measurement using one or more second characteristics of the instance of the first type of geometric element or one or more of the instances of the second type of geometric element associated therewith.

10. The method recited in claim 7, wherein:
the one or more characteristics are of an occurrence of the first type of geometric element relative to one or more occurrences of the second type of geometric element, or
the one or more characteristics are of one or more occurrences of the second type of geometric element relative to an occurrence of the first type of geometric element.

11. The method recited in claim 7, further comprising separately evaluating the model function for each of a plurality of specified instances of the first type of geometric element, using the value of the measurement determined for that specified instance of the first type of geometric element.

12. The method recited in claim 7, wherein the model function is a non-mathematical function.

13. The method recited in claim 7, wherein the relationship is selected from the group consisting of: intersecting, overlapping, abutting, electrically connected, inside of a bounding box and a combination thereof.

14. The method recited in claim 7, wherein
the first type of geometric element is occurrences of a category of geometric elements having one or more specified attributes, or
the second type of geometric element is occurrences of a category of geometric elements having one or more specified attributes.

15. The method recited in claim 7, further comprising:
modifying the microdevice layout design based upon the evaluation of the model function.

16. A computer-readable storage medium having stored thereon a set of program instructions that are executable by a computer to perform the method comprising:
analyzing a microdevice layout design to identify instances of a first type of geometric element;
for identified instances of the first type of geometric element,
determining if the instance of the first type of geometric element shares a defined relationship with one or more instances of a second type of geometric element occurring in the microdevice layout design, and
if the instance of the first type of geometric element shares the defined relationship with one or more instances of the second type of geometric element, then associating the instance of the first type of geometric element with the one or more instances of the second type of geometric element;

for a specified instance of the first type of geometric element associated with one or more instances of the second type of geometric element, determining a value of a measurement using one or more characteristics of the specified instance of the first type of geometric element associated or one or more instances of the second type of geometric element associated therewith; and evaluating a model function using the value of the measurement determined for the specified instance of the first type of geometric element.

* * * * *